United States Patent
Wittmann et al.

(10) Patent No.: US 10,756,245 B2
(45) Date of Patent: Aug. 25, 2020

(54) OPTOELECTRONIC COMPONENT WITH A LEAD FRAME SECTION

(71) Applicant: OSRAM OLED GmbH, Regensburg (DE)

(72) Inventors: Michael Wittmann, Alteglofsheim (DE); Martin Brandl, Kelheim (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/079,749

(22) PCT Filed: Feb. 24, 2017

(86) PCT No.: PCT/EP2017/054382
§ 371 (c)(1),
(2) Date: Aug. 24, 2018

(87) PCT Pub. No.: WO2017/144691
PCT Pub. Date: Aug. 31, 2017

(65) Prior Publication Data
US 2019/0074418 A1   Mar. 7, 2019

(30) Foreign Application Priority Data
Feb. 25, 2016  (DE) .................. 10 2016 103 354

(51) Int. Cl.
*H01L 33/62* (2010.01)
*H01L 33/44* (2010.01)
(Continued)

(52) U.S. Cl.
CPC .............. *H01L 33/62* (2013.01); *H01L 33/44* (2013.01); *H01L 33/486* (2013.01); *H01L 33/60* (2013.01);
(Continued)

(58) Field of Classification Search
CPC ................................ H01L 33/44; H01L 33/62
(Continued)

(56) References Cited

U.S. PATENT DOCUMENTS

2011/0269269 A1   11/2011   Tu et al.
2012/0313131 A1   12/2012   Oda et al.
(Continued)

FOREIGN PATENT DOCUMENTS

DE   10 2014 111 483 A1      2/1916
DE      102014111483 A1 *   2/2016   ............. H01L 21/48
(Continued)

OTHER PUBLICATIONS

Machine Translation of DE 10201411483 A1 (Year: 2016).*
(Continued)

*Primary Examiner* — Marvin Payen
(74) *Attorney, Agent, or Firm* — DLA Piper LLP (US)

(57) ABSTRACT

An optoelectronic component has at least one lead frame section, wherein an optoelectronic element is arranged on the lead frame section, a mold material is applied at least on a first face of the lead frame section and adhesively connected to the lead frame section by the first face, the lead frame section consists of a predetermined material, a part of the first face of the lead frame section is provided with a coating, a region of the first face is free of the coating, and the mold material connects to the material of the lead frame section in the free region.

20 Claims, 5 Drawing Sheets

(51) Int. Cl.
*H01L 33/48* (2010.01)
*H01L 33/60* (2010.01)

(52) U.S. Cl.
CPC .............. *H01L 2933/0025* (2013.01); *H01L 2933/0033* (2013.01); *H01L 2933/0066* (2013.01)

(58) Field of Classification Search
USPC .................................................. 257/98–106
See application file for complete search history.

(56) References Cited

U.S. PATENT DOCUMENTS

| | | |
|---|---|---|
| 2013/0181236 A1 | 7/2013 | Tamaki et al. |
| 2014/0042471 A1 | 2/2014 | Toyama et al. |
| 2015/0207042 A1 | 7/2015 | Yoneda et al. |
| 2015/0280084 A1 | 10/2015 | Sugawara |

FOREIGN PATENT DOCUMENTS

| | | |
|---|---|---|
| JP | 2002-84004 A | 3/2002 |
| JP | 2012-231068 A | 11/2012 |
| JP | 2014-49594 A | 3/2014 |
| JP | 2015-15265 A | 1/2015 |
| JP | 2015-188081 A | 10/2015 |
| WO | 2011/122665 A1 | 10/2011 |

OTHER PUBLICATIONS

Notice of Reasons for Rejection dated Aug. 6, 2019, of counterpart Japanese Application No. 2018-544536 along with an English translation.

\* cited by examiner

OPTOELECTRONIC COMPONENT WITH A LEAD FRAME SECTION

TECHNICAL FIELD

This disclosure relates to an optoelectronic component having a lead frame section, and a method of producing the component.

BACKGROUND

It is known to embed lead frames, on which an LED is arranged, in a housing material.

There is nonetheless a need to provide an optoelectronic component having a lead frame section, in which the lead frame section is connected reliably to the mold material by simple means, as well as to provide a simple method of producing the component.

SUMMARY

We provide an optoelectronic component having at least one lead frame section, wherein an optoelectronic element is arranged on the lead frame section, a mold material is applied at least on a first face of the lead frame section and adhesively connected to the lead frame section by the first face, the lead frame section consists of a predetermined material, a part of the first face of the lead frame section is provided with a coating, a region of the first face is free of the coating, and the mold material connects to the material of the lead frame section in the free region.

We also provide a method of producing an optoelectronic component having at least one lead frame section including providing a coating on a part of the surface of the lead frame section, wherein a first region of a first face remains free of the coating, applying mold material at least onto the first face of the lead frame section, wherein the mold material bounds at least a part of a recess, and arranging an optoelectronic element on the lead frame section in the region of the part of the recess.

Figure 1:
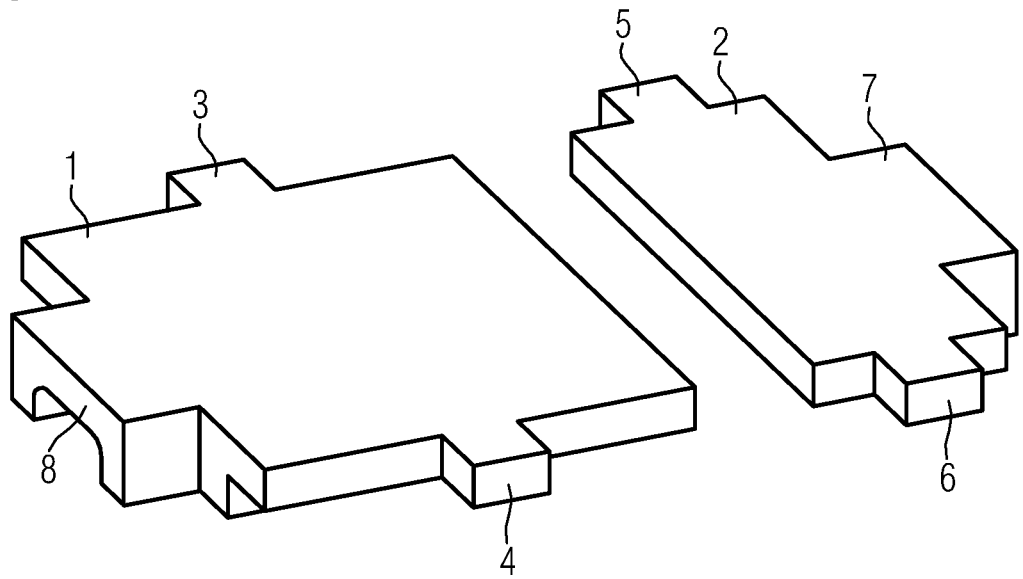
FIG. 1 shows a schematic representation of two lead frame sections.

LIST OF REFERENCES 1 first lead frame section
2 second lead frame section
3 to 8 border elements
9 coating
10 first free region
11 second free region
12 third free region
13 fourth free region
14 fifth free region
15 sixth free region
16 first central region
17 second central region
18 seventh free region
19 eighth free region
20 mold material
21 recess
22 element
23 bond wire
24 housing
25 encapsulation material
26 ninth free region
29 tenth free region
31 first side edge of first lead frame section
32 second side edge of first lead frame section
33 third side edge of first lead frame section
34 fourth side edge of first lead frame section
35 lateral distance
41 first side edge of second lead frame section
42 second side edge of second lead frame section
43 third side edge of second lead frame section
44 fourth side edge of second lead frame section
50 planar face
51 border region
52 point face

DETAILED DESCRIPTION

Our components achieve good adhesion of the mold material on the lead frame section by simple production methods. This is achieved by a part of the surface, on which the mold material bears on the lead frame section, being free of the coating of the lead frame section.

To this end, an optoelectronic component having at least one lead frame section is provided, wherein an optoelectronic element is arranged on the lead frame section, a mold material is applied at least on a first face of the lead frame section and adhesively connected to the lead frame section by the first face, the lead frame section consists of a material, a part of the first face of the lead frame section is provided with a coating, and at least one first region of the first face is free of the coating.

The free region may subdivide the coating into a central region and an outer border region, the element being arranged in the central region. This example offers the advantage that the free region can be introduced straightforwardly into the coating, in particular afterwards. To improve adhesion of the mold material, a narrow free, in particular strip-shaped, region may be sufficient.

The first face may be formed annularly on an upper side of the lead frame section, the mold material likewise being formed annularly and delimiting a recess. The element is arranged in the recess, the coating being arranged on the upper side of the lead frame section. The free region annularly encloses the element and is arranged under the mold material. The free region separates the central region of the coating from an outer border region of the coating.

The first face may be formed partially annularly on an upper side of the lead frame section and adjoins with ends a side edge of the lead frame section. The mold material is formed partially annularly on the lead frame section and bounds a part of a recess. The coating is arranged on the upper side of the lead frame section. The element is arranged on a central region of the coating in the recess. The free region partially annularly encloses the element and is arranged under the mold material. The free region separates the coating from a partially annular outer border region of the coating.

A second lead frame section may be provided, the second lead frame section being arranged at a distance from the first lead frame section. The lead frame sections are arranged facing toward one another respectively with a first side edge, the two lead frame sections connected to one another by mold material. The first face is formed partially annularly on the upper side of the first lead frame section, ends of the first face adjoining the first side edge of the lead frame section. The coating is arranged on the upper side of the first lead frame section, the free region of the coating separating a first central region from an outer border region of the coating and being arranged in the first face. The mold material is formed partially annularly on the first face on the first lead frame section. The second lead frame section has a coating on the upper side. The mold material is formed annularly and encloses a recess. The recess extends over subfaces of the upper sides of the first and the second lead frame section. The mold material is arranged partially annularly on the upper side of the second lead frame section. The coating of the second lead frame section has a free region, the free region separating a second central region of the coating from an outer border region of the coating. The free region is arranged under the mold material, the free region being guided annularly from a first side edge of the second lead frame section around the second central region back to the first side edge. In this way, good adhesion of the mold material is also achieved in two lead frame sections connected to one another.

The free regions of the coating of the first and/or of the second lead frame section may be formed partially annularly and/or in a U-shape and/or in the shape of an angled U-shape. These geometries of the free regions can be produced straightforwardly and precisely.

The lead frame section may have a coating on a side edge, a free region being formed in the coating of the side edge, the mold material covering the side edge. In this way, improved adhesion of the mold material can also be achieved on a side edge of the lead frame section.

The lead frame section may have a coating on a first side edge, a free region being formed in the coating of the first side edge, the free region of the first side edge extending over at least a width of the recess. In this way, improved adhesion and/or sealing between the side edge of the lead frame section and the mold material is achieved, particularly in the region of the recess.

The element may be in the form of a light-emitting diode. Particularly in light-emitting diodes, reliable mechanical connection between the lead frame section and the mold material is advantageous.

The material of the lead frame section may be a metal, in particular copper.

The coating may comprise a metal. With the aid of the metal, the desired optical and chemical properties can be achieved straightforwardly and economically. The coating may comprise nickel and/or silver and/or palladium and/or gold.

The lead frame section may be embedded at least partially in the mold material. In this way, improved protection of the lead frame section can be achieved. The mold material may form a part of a housing. A simple structure is therefore made possible.

An improvement of the adhesion and/or leaktightness between the mold material and the lead frame section can already be achieved with very narrow free regions. For example, the width of the free regions may be less than 0.8 mm, in particular less than 0.5 mm. The width of the free regions may be less than 0.2 mm. In particular, the width of the free regions may be less than 100 µm, in particular less than 50 µm and may, for example, lie in the range of 10 µm. Even free regions with a width of less than 100 µm, and in particular with a width at 10 µm, lead to an improvement of the adhesion and the sealing. In particular, the free region with the small widths can be introduced rapidly and precisely into the coating, for example, with a laser beam. In this way, a free region can also be provided in small-area lead frame sections.

A method of producing an optoelectronic component having at least one lead frame section is proposed, wherein an optoelectronic component is arranged on the lead frame section, the lead frame section consists of a material, a part of the surface of the lead frame section is provided with a coating, at least a first region of a first face remains free of the coating, and mold material is applied at least onto the first face of the first lead frame section and enters into an adhesive connection with the first lead frame section.

The coating may initially be applied onto the first face, the coating subsequently being removed in the first region. In this way, a precise shape of the first region can be produced.

The first region of the first face may be covered with the aid of a cover during the application of the coating, and the coating may be applied in the first face outside the first region. This makes it possible to produce the free region with simple means.

Our components and methods will be explained in more detail below with the aid of the figures.

Figure 2:
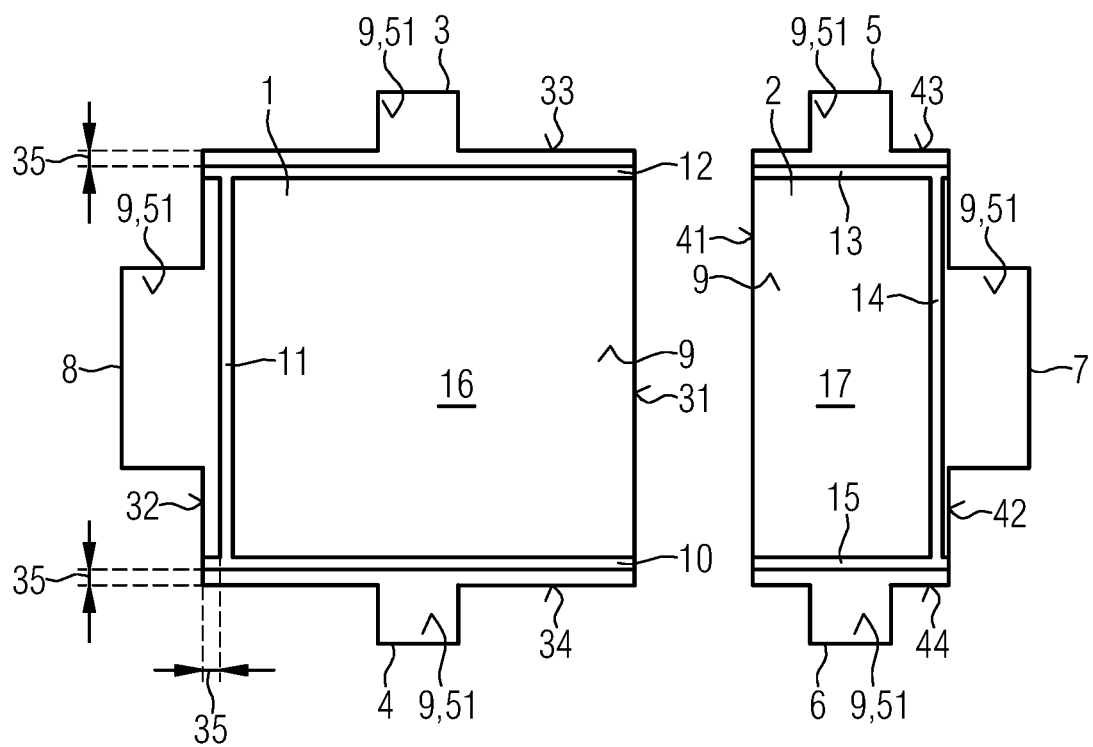
FIG. 2 shows the two lead frame sections with a view from above with a coating and regions without coating.

FIG. 1 shows a first lead frame section 1 and a second lead frame section 2 in a schematic perspective representation. The lead frame sections are, for example, produced from a metal, in particular copper, by stamping and/or etching. The lead frame sections 1, 2 have strip-like border elements, so-called tiebars 3, 4, 5, 6, 7, 8, on side faces. To improve chemical and optical properties, at least the upper side of the lead frame sections 1, 2 is provided with a coating 9, as is schematically represented in FIG. 2. The coating 9 may, for example, increase reflection of electromagnetic radiation. Furthermore, the coating may facilitate electrical contacting and/or protect the material of the lead frame section.

FIG. 2 shows the lead frame sections 1, 2 from above, the upper sides of the lead frame sections 1, 2 being provided with the coating 9. For example, a nickel-silver alloy may be used for the coating. The coating may comprise or consist of nickel and/or silver and/or palladium and/or gold.

The coating 9 may also comprise or consist of other metals or alloys. Furthermore, the lead frame sections 1, 2 have free regions 10, 11, 12, 13, 14, 15 free of the coating 9. In the example represented, the free regions 10, 11, 12, 13, 14, 15 are configured in the form of straight strips that separate a central region 16, 17 of the coating 9 of the lead frame section 1, 2 from the border regions 51 of the coating 9, in particular from border regions with the border elements 3, 4, 5, 6, 7, 8. Instead of the straight strip shape, the free regions may also have a linear shape, points or other surface shapes.

Furthermore, for example, only one of the strip-shaped free regions, or a plurality of the strip-shaped free regions, may be provided on the upper side of the first lead frame section 1. The third free region 12 is guided from a first side edge 31 of the first lead frame section 1 to an opposite second side edge 32 of the first lead frame section 1. The first free region 10 is arranged opposite the third free region 12, and guided from the first side edge 31 of the first lead frame section 1 to the opposite second side edge 32 of the first lead frame section 1. The second free region 11 is likewise configured as a narrow strip, and arranged perpendicularly to the third free region 12 and the first free region 10 and, therefore, parallel to the second side edge 32. The strip-shaped third free region 12 is arranged parallel to the third side edge 33 of the first lead frame section 1. The strip-shaped first free region 10 is arranged parallel to the fourth side edge 34 of the first lead frame section 1.

The strip-shaped first, second and third free regions 10, 11, 12 have a lateral distance 35 from the adjacent side edges 32, 33, 34, parallel to which they are guided, which is less than ¼ or less than ⅕ of a width of the first lead frame section 1 perpendicular to the longitudinal extent of the respective strip-shaped free region 10, 11, 12. The lateral distance 35 may be less than 0.5 mm, in particular less than 150 µm. The strip-shaped free regions may have a width, perpendicular to their longitudinal extent, which is 1 mm or less.

For example, the width of the free regions perpendicular to a longitudinal extent may be less than 0.8 mm, in particular less than 0.5 mm. The width of the free regions may be less than 0.2 mm. In particular, the width of the free regions may be less than 100 µm, in particular less than 50 µm and may, for example, lie in the range of 10 µm. Tests have shown that even free regions with a width in the range of 10 µm lead to an improvement of the adhesion and the sealing. In particular, the free regions with the small widths can be introduced rapidly and precisely into the coating, for example, with a laser beam.

In this way, outer border regions 51 of the coating 9 of the first lead frame section 1 adjacent to the second side edge 32, the third side edge 33 and the fourth side edge 34 are separated from the first central region 16 of the coating 9 by the U-shaped structure of the first, second and third free regions 10, 11, 12. In this way, the border elements 3, 4, 8 are also separated from the first central region 16 of the coating 9 by the strip-shaped first, second and third free regions 10, 11, 12.

The first and the third strip-shaped free regions 10, 12, that respectively start from the first side edge 31, may also end at a distance from the second side edge 32. It is, however, advantageous for the second free region 11 arranged along the second side edge 32 to open with one end into the first free region 10 and the other end into the third free region 12. In this way, a structure extending continuously in the shape of a ring around the first central region 16, with connected free regions 10, 11, 12, is provided in the coating 9. The annularly circumferential structure may also have an angled U-shape, or other shapes.

Furthermore, for example, only one of the strip-shaped free regions, or a plurality of the free regions 13, 14, 15, may be provided in the coating 9 on the upper side of the second lead frame section 2. A fourth free region 13 is guided from a first side edge 41 of the second lead frame section 2 to an opposite second side edge 42. A sixth free region 15 is arranged opposite the fourth free region 13, and likewise guided from the first side edge 41 to the opposite second side edge 42 of the second lead frame section 1. A fifth free region 14 is likewise configured as a narrow strip and arranged perpendicular to the fourth free region 13 and the sixth free region 15 and, therefore, parallel to the second side edge 42. The strip-shaped fourth free region 13 is arranged parallel to a third side edge 43 of the second lead frame section 2. The strip-shaped sixth free region 15 is arranged parallel to a fourth side edge 44 of the second lead frame section 2. The strip-shaped fourth, fifth and sixth free regions 13, 14, 15 have a lateral distance 35 from the adjacent side edges 42, 43, 44, parallel to which they are guided, which is less than ¼ or less than ⅕ of a width of the second lead frame section 2 perpendicular to the longitudinal extent of the respective strip-shaped free region 13, 14, 15. The lateral distance 35 may be less than 0.5 mm, in particular less than 150 µm. The strip-shaped fourth, fifth and/or sixth free regions 13, 14, 15 may have a width, perpendicular to their longitudinal extent, which is 1 mm or less.

For example, the width of the free regions may be less than 0.8 mm, in particular less than 0.5 mm. The width of the free regions may be less than 0.2 mm. In particular, the width of the free regions may be less than 100 µm, in particular less than 50 µm and may, for example, lie in the range of 10 µm. Tests have shown that even free regions with a width in the range of 10 µm lead to an improvement of the adhesion and the sealing. In particular, the free regions with the small widths can be introduced rapidly and precisely into the coating, for example, with a laser beam.

In this way, outer border regions 51 of the coating 9 of the second lead frame section 2 with the second side edge 42, the third side edge 43 and the fourth side edge 44 are separated from a second central region 17 of the coating 9 by the continuous U-shaped structure of the fourth, fifth and sixth free regions 13, 14, 15. In this way, the border elements 5, 6, 7 are also separated from the second central region 17 of the coating 9 by the strip-shaped free regions 13, 14, 15.

The strip-shaped fourth and sixth free regions 13, 15 may respectively be guided as far as the first side edge 41, or they may end at a distance from the second side edge 42. It is, however, advantageous for the fifth free region 14 arranged along the second side edge 42 to open with one end into the fourth free region 13 and the other end into the sixth free region 15. In this way, a structure extending continuously in the shape of a ring around the second central region 17, with connected free regions 13, 14, 15, is provided in the coating 9.

Figure 3:
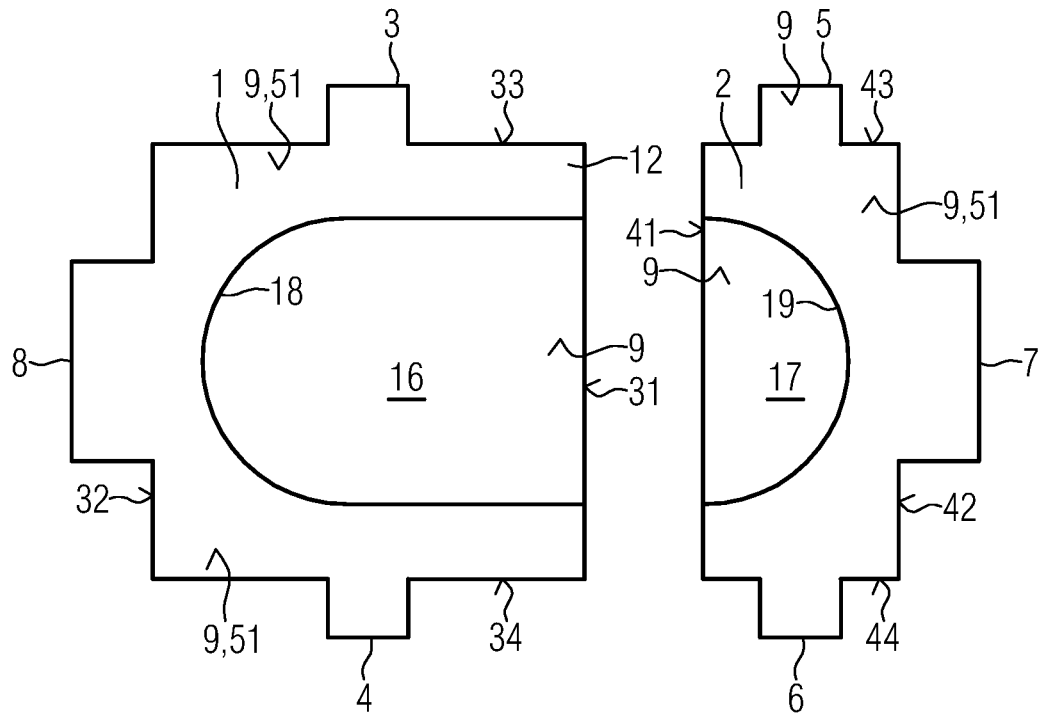
FIG. 3 shows a representation of the lead frame sections embedded in a mold material.

FIG. 3 shows an example in which a seventh and an eighth free region 18, 19 are configured in the form of two U-shaped lines in the coating 9 of the lead frame sections 1, 2. In this example as well, outer border regions 51 of the coating 9 adjacent to the second, third and fourth side edges 32, 33, 34 of the first lead frame section 1 are separated from the first central region 16, and outer border regions 51 of the coating 9 adjacent to the second, third and fourth side edges 42, 43, 44 of the second lead frame section 2 are separated from the second central region 17, by the free regions 18, 19. The corresponding border elements 3, 4, 5, 6, 7, 8 are therefore also separated from the central regions 16, 17 by the seventh and eighth free regions 18, 19. In this example as well, the free regions 18, 19 may be configured in the form of points which are arranged along the U-shaped line shape.

The seventh free region 18 of the coating 9 of the first lead frame section 1 has a U-shape, the two ends of the U-shape ending at the first side edge 31 of the first lead frame section 1. The eighth free region 19 of the coating 9 of the second lead frame section 2 has a U-shape, the two ends of the U-shape ending at the first side edge 41 of the second lead frame section 2. Instead of the U-shape, the seventh and eighth regions 18, 19 may also have an angled U-shape or a partial circle shape, or another circumferential shape, which separates the central region 16, 17 of the coating 9 from an outer border region 51 of the coating 9. The ends of the seventh and the eighth free regions 18, 19 should respectively be guided as far as the first side edge 31, 41 of the respective lead frame section 1, 2.

The free regions 10 to 15, 18, 19 of FIGS. 2 and 3 may, for example, be produced by the faces of the free regions 10 to 15, 18, 19 being covered with the aid of a protective layer, for example, photoresist or a mechanical mask during deposition of the coating 9. The coating 9 may, for example, be deposited with the aid of an electrolytic coating method. Furthermore, the entire surfaces of the first and the second lead frame sections 1, 2 may be provided with the coating 9, and the free regions 10 to 15 and 18, 19 may subsequently be produced in the desired shape by corresponding removal of the coating 9. For example, the free regions 10 to 15 and 18, 19 may be produced with the aid of a laser ablation method, the coating 9 being removed from the surface of the lead frame sections 1, 2 by laser ablation in the face regions of the intended free regions 10 to 15 and 18, 19.

Figure 4:
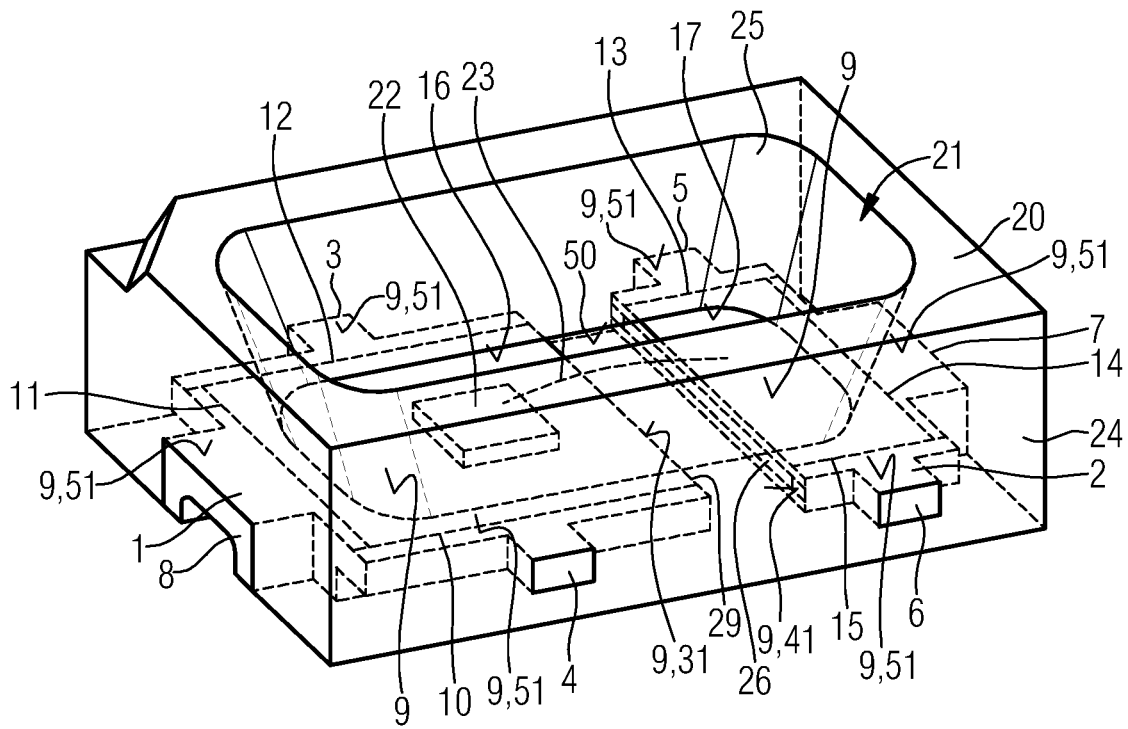
FIG. 4 shows a finished component in transparent representation.

Subsequently, a mold material 20 is applied onto the lead frame sections 1, 2, as represented in FIG. 4 schematically for the example of the lead frame sections 1, 2 of FIG. 2. In this case, the lead frame sections 1, 2 are covered by mold material 20 at least on an upper side in border regions, which are guided starting from the central regions 16, 17 outward over the first, second, third, fourth, fifth, and sixth free regions 10 to 15 to side edges of the lead frame sections. The first, second, third, fourth, fifth, and sixth free regions 10, 11, 12, 13, 14, 15 are represented in the form of dashed lines. Furthermore, the two lead frame sections 1, 2 connect to one another at a predetermined distance by the mold material 20. Between the first side edge 31 of the first lead frame section 1 and the first side edge 41 of the second lead frame section 2, a planar face 50 is formed from mold material 20. A semi-annular border region of a lead frame section 1, 2 is therefore respectively covered by mold material 20. The central regions 16, 17 of the lead frame sections 1, 2 are at least partially free of the mold material 20. The free regions 10 to 15 of the coating 9 are covered by the mold material 20. The mold material 20 has a recess 21 delimited by the mold material 20 annularly in the form of a frame. The recess 21 extends from an upper side of the mold material 20 to the upper side of the lead frame sections 1, 2 in the central regions 16, 17. The recess 21 is bounded by the annularly configured mold material 20, by exposed subregions of the surfaces of the lead frame sections 1, 2 and, in the intermediate region between the first side edges 31, 41 of the two lead frame sections 1, 2, by the planar face 50 consisting of the mold material 20. The planar face 50 of the mold material is arranged at the same height as the upper sides of the lead frame sections 1, 2. In the region of the free regions 10 to 15, a direct connection is established between the material of the lead frame sections and the mold material. In this way, the mechanical adhesive connection is improved. Furthermore, improved sealing is achieved between the lead frame sections and the mold material.

The recess 21 may be produced during the embedding of the lead frame sections 1, 2 in the mold material 20. Furthermore, the recess 21 may also be produced afterwards by removing mold material 20. Subsequently, an optoelectronic element 22 is mounted on the first central region 16 of the first lead frame section 1. Furthermore, an electrically conductive connection is established between the element 22 and the second lead frame section 2, for example, with the aid of a bond wire 23.

Subsequently, the recess 21 is encapsulated with an encapsulation material 25. This method stage is also represented in FIG. 4, the mold material 20 being represented transparently. In this way, sealing of the element 22 is achieved. Because of the better sealing between the mold material 20 and the free regions 10, 11, 12, 13, 14, 15 of the coating 9, flow of the liquid mold material between the lead frame section 1, 2 and the mold material 20 is avoided.

The free regions 10 to 15 allow direct contact between the material of the lead frame sections 1, 2 and the mold material 20. This permits a strong connection between the mold material 20 and the free regions 10 to 15, i.e. good adhesion with high adhesion forces and/or good surface adhesion is achieved. In particular, good adhesion between a copper surface of the lead frame section is achieved. In this way, the mechanical stability of the connection between the mold material and the lead frame sections is furthermore improved. In addition, a moisture-tight connection between the mold material and the lead frame section can be achieved. In this way, penetration of moisture to the optoelectronic element is made difficult, in particular prevented. Furthermore, penetration or through-flow of other liquids, for example, fluxing agent, tin residues, cleaning liquids or the like can be made difficult or avoided.

With the aid of FIG. 4, it can be seen that the border elements 3, 4, 5, 6, 7, 8 of the lead frame sections 1, 2 adjoin the outer side faces of the mold material 20. This entails the risk that moisture may penetrate to the element 22 through the exposed border elements 3 to 8. Because of the free regions arranged around the central region 16, 17 of the coating 9 on the first or second lead frame section 1, 2, however, a very tight connection is achieved between the mold material and the lead frame section. The moisture cannot therefore migrate through this barrier region. The border elements 3, 4, 5, 6, 7, 8 of the lead frame sections 1, 2 may be omitted, and the lead frame sections 1, 2 are also embedded laterally in the mold material 20.

With the aid of lasers or a photoresist technique, very small free regions 10 to 15 with precise faces may be produced in the coating 9 on the upper sides of the lead frame sections 1, 2 after the extensive application of the coating 9 onto the surface of the lead frame sections 1, 2 and before the application of the mold material 20 onto the coating 9. This method may therefore also be used in very small components to provide a large region of the surface of the lead frame sections 1, 2 with the coating 9, and only to provide small free regions in which the material of the lead frame sections 1, 2 is exposed and the coating 9 is removed. Good sealing for the element 22 is achieved by the direct contact between the material of the lead frame sections and the mold material. The longterm stability of the sealing of the component is therefore improved.

In the example of FIG. 4, side edges 31, 32, 33, 34, 41, 42, 43, 44 of the lead frame sections 1, 2 are covered at least partially by mold material. The first side edge 31 of the first lead frame section 1 and the first side edge 41 of the second lead frame section 2 are fully covered by the mold material 20. Furthermore, the first side edge 31 of the first lead frame section 1 and the first side edge 41 of the second lead frame section 2 adjoin the planar face 50 and the recess 21 filled with encapsulation material 25.

Side edges 31, 32, 33, 34 of the first lead frame section 1 and/or side edges 41, 42, 43, 44 of the second lead frame section 2 may also be provided with the coating 9. Furthermore, a free region may also be provided on a side edge 31, 32, 33, 34, 41, 42, 43, 44 of the first and the second lead frame sections 1, 2, in which region no coating 9 is arranged on the material of the lead frame sections 1, 2, or a free region has been introduced into the coating 9 after the application of the coating 9.

In particular, the first side edge 41 of the second lead frame section 2 may be provided with the coating 9. In the coating 9, a ninth free region 26 is provided on the first side edge 41. The ninth free region 26 is, for example, configured in the form of a straight strip, and extends transversely over the entire length of the first side edge 41. In the example represented, the ninth free region 26 adjoins the third side edge 43 and the fourth side edge 44. The ninth free region 26 may also end at a predetermined distance from the third and the fourth side edges 43, 44. Advantageously, the ninth free region 26 extends at least over the entire width of the recess 21.

On the opposite first side edge 31 of the first lead frame section 1, a coating 9 is likewise provided. Furthermore, a tenth free region 29 is introduced in the coating 9 of the first side edge 31 of the first lead frame section 1. The tenth free region 29 is configured in the form of a straight strip, and extends transversely over the entire length of the first side edge 31. The free region 29 adjoins the third side edge 33 and the fourth side edge 34. The tenth free region 29 may also end at a predetermined distance from the third and the fourth side edges 33, 34. Advantageously, the tenth free region 29 extends at least over the entire width of the recess 21.

Figure 5:
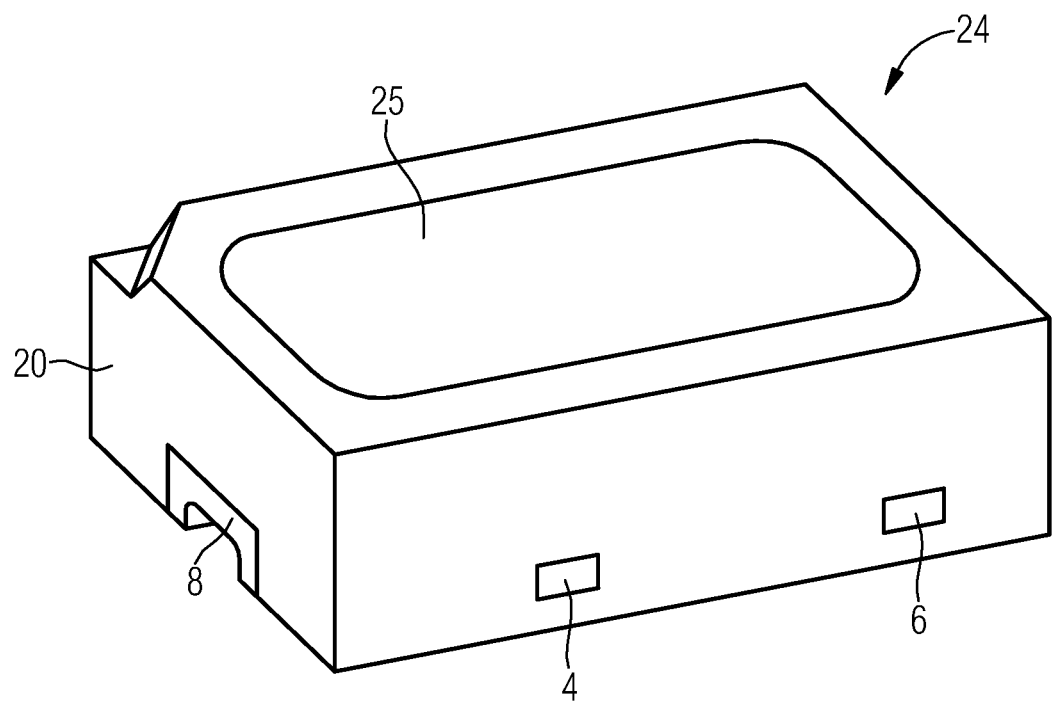
FIG. 5 shows the component of FIG. 4 in perspective representation.

FIG. 5 shows the arrangement of FIG. 4, the encapsulation material 25 and the mold material 20 constituting a housing 24.

Figure 6:
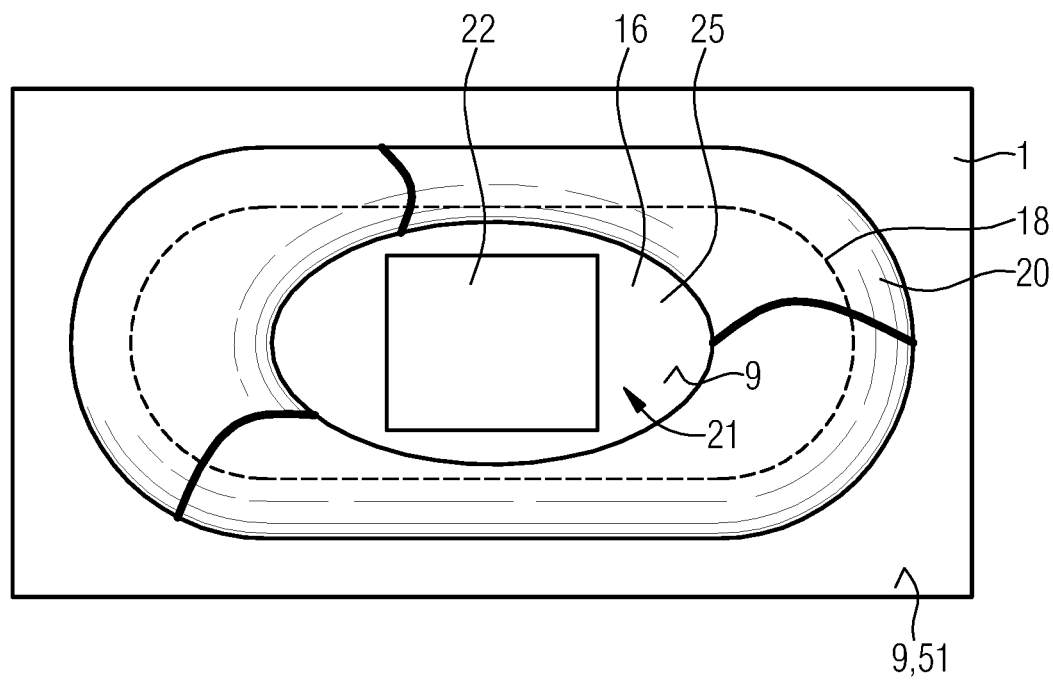
FIG. 6 shows a further component having a lead frame section.

The optoelectronic component may also have only one lead frame section 1, on which the optoelectronic element 22 is arranged, as represented schematically in FIG. 6. In this example, the first central region 16 of the first lead frame section 1 may be annularly enclosed by mold material 20 in the form of a bead. The upper side of the first lead frame section is provided with a coating 9. The mold material 20 is arranged on an annular first face on the coating 9. A seventh free region 18, in which no coating 9 is arranged on the upper side of the first lead frame section 1, is configured in the form of a continuous annular face, which likewise lies in the first face. The seventh free region 18 is covered by mold material 20. In the seventh free region 18, the material of the first lead frame section 1 directly adjoins the mold material 20. An internal space formed by the annular mold material 20 and constituting a recess 21 is filled with encapsulation material 25. The optoelectronic element 22 is annularly enclosed by the mold material 20 and arranged in the recess 21 on the first lead frame section 1. The element 22 and the central region 16 are therefore covered by the encapsulation material 25. The seventh free region 18 may also have other surface shapes that annularly enclose the central region 16 of the coating 9. For example, the seventh free region 18 may consist circumferentially around the central region 16 and under the mold material 20 of three or four strip-shaped regions, in particular straight strip-shaped regions that adjoin one another. Furthermore, the seventh free region 18 may also be configured in the form of mutually sequential point faces that, as an annular line, enclose the central region 16 and separate it from an outer border region 51 of the coating 9.

Figure 7:
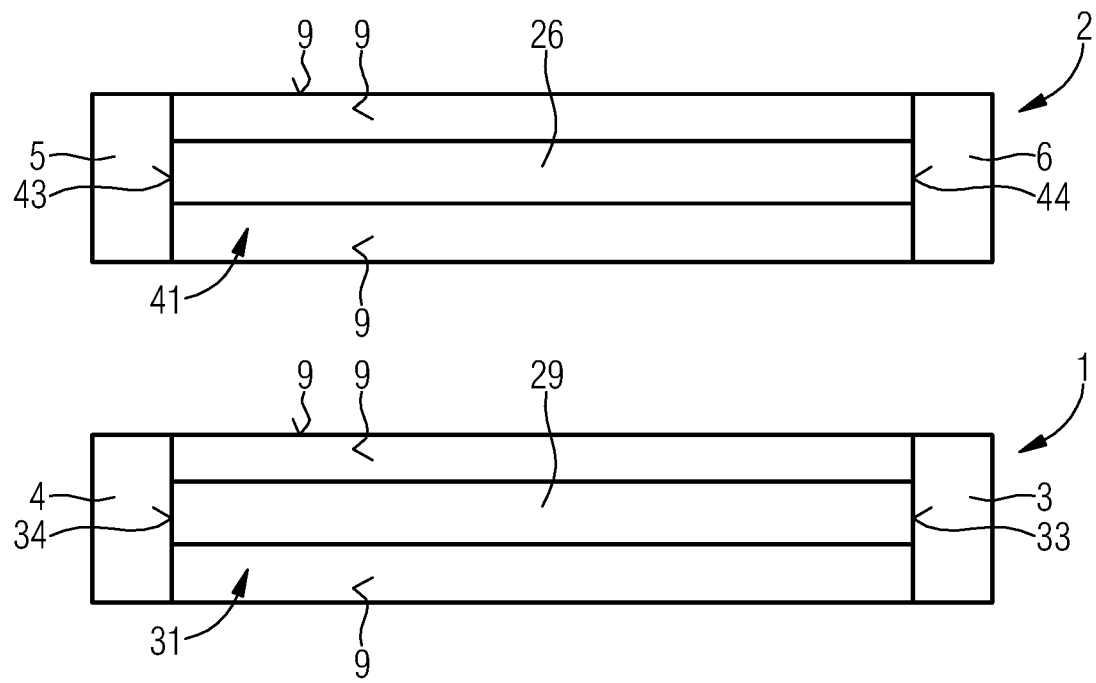
FIG. 7 shows a side view of the first and the second lead frame sections.

FIG. 7 schematically shows an arrangement of the first and the second lead frame sections 1, 2 configured according to FIGS. 2 and 4. The lead frame sections 1, 2 are represented above one another respectively with a view of the first side edge 31, 41 of the lead frame sections 1, 2. The lead frame sections 1, 2 are provided with the coating 9 on the upper side, as represented in FIGS. 2 and 4. Furthermore, the lead frame sections 1, 2 are also provided with the coating 9 on the first side edge 31, 41. In the coating 9 of the first side edges 31, 41 of the lead frame sections 1, 2, a ninth and a tenth free region 29, 26 are respectively introduced.

The ninth free region 26 of the first side edge 41 of the second lead frame section 2 is configured in the form of a straight strip, and extends transversely over the entire length of the first side edge 41. The ninth free region 26 adjoins the third side edge 43 and the fourth side edge 44. The tenth free region 29 of the first side edge 31 of the first lead frame section 1 is configured in the form of a straight strip, and extends transversely over the entire length of the first side edge 31. The tenth free region 29 adjoins the third side edge 33 and the fourth side edge 34.

The ninth and the tenth free regions 29, 26 of the first side edges 31, 41 of the first and the second lead frame sections 1, 2 may also be configured to be shorter and not extend to the side edges. By providing the ninth and tenth free regions 26, 29, the adhesive effect between the mold material 20 and the first side faces 31, 41 of the lead frame sections 1, 2 is increased, even though a coating 9 is provided on the first side faces 31, 41.

Figure 8:
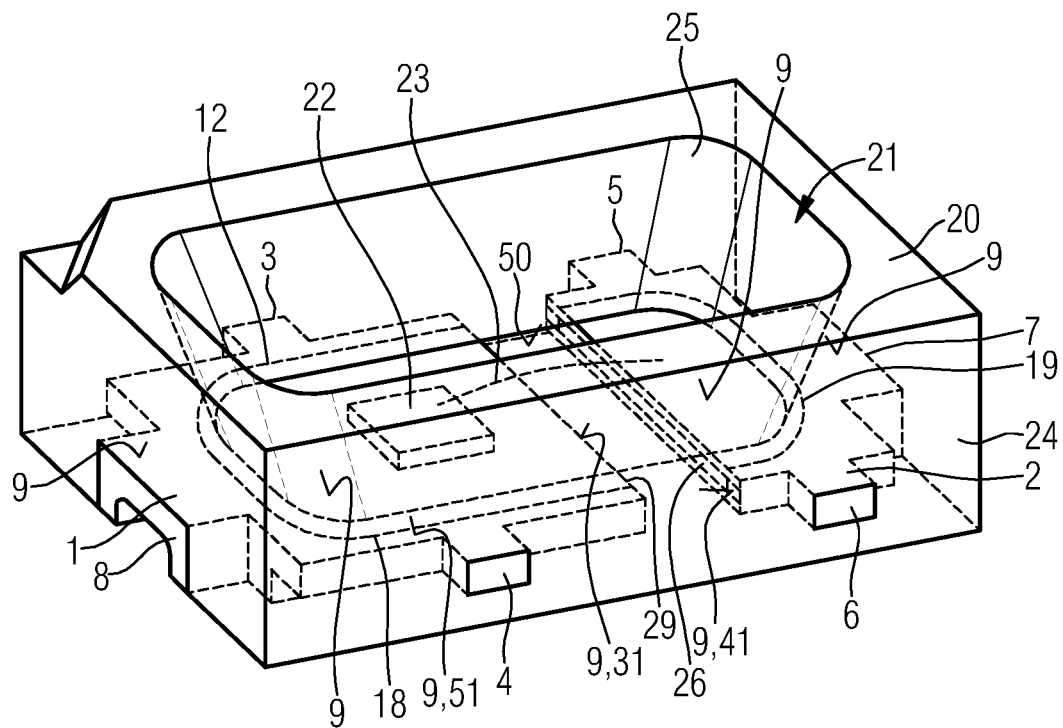
FIG. 8 shows a further finished component.

The other side edges 32, 33, 34, 42, 43, 44 of the lead frame sections 1, 2 may also be provided with a coating 9, in which case the coating 9 may have free regions on the side edges 32, 33, 34, 42, 43, 44 of the lead frame sections 1, 2. FIG. 8 shows a further finished component essentially configured according to the component of FIG. 4, although the coating 9 of the first lead frame section 1 has a seventh free region 18 and the coating 9 of the second lead frame section 2 has an eighth free region 19 according to FIG. 3. The seventh and eighth free regions 18, 19 are represented as dashed lines.

Figure 9:
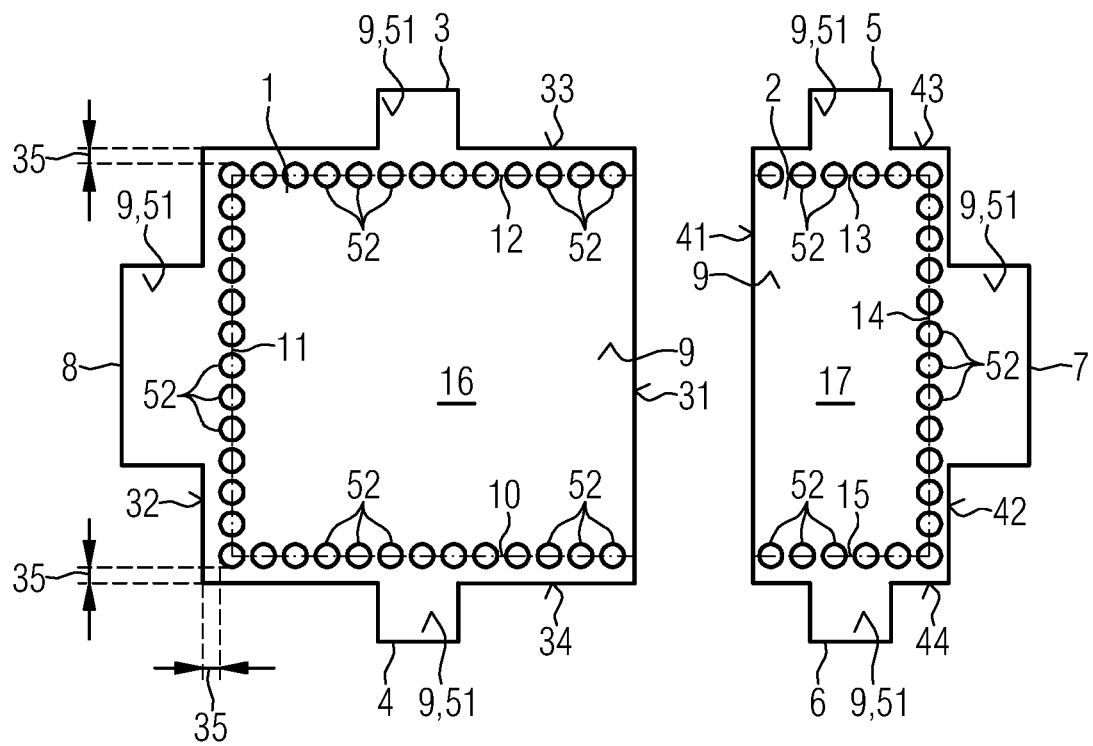
FIG. 9 shows two lead frame sections with free regions in the form of point faces.

FIG. 9 shows a schematic representation of one example of lead frame sections 1, 2 essentially configured according to FIG. 2 although, in this example, the first, the second, the third, the fourth, the fifth and the sixth free regions 10, 11, 12 are configured in the form of point faces 52 arranged in rows. The distances of the point faces 52 from one another may be constant and may, for example, be less than a diameter of the point faces 52. The distances between the point faces may also vary. The point faces 52 may have a circular face shape, a rectangular face, a square face or other surface shapes. The point faces 52 may be of the same size or have different sizes. The diameter of a point face 52 may, for example, be less than 1 mm.

Figure 10:
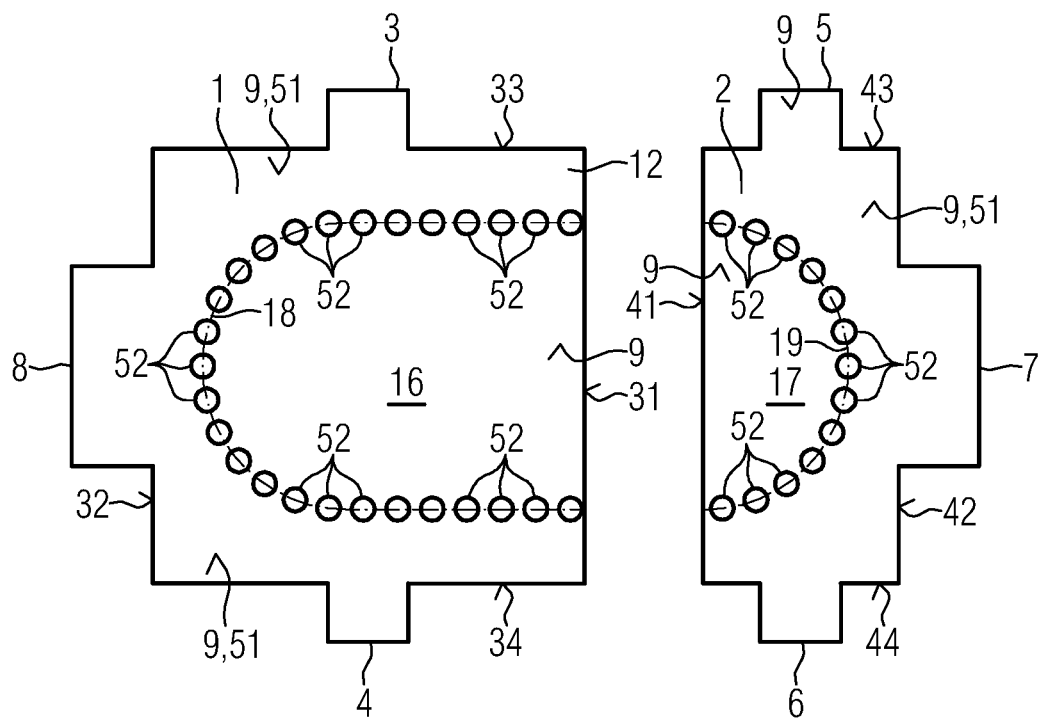
FIG. 10 shows two further lead frame sections with free regions in the form of point faces.

FIG. 10 shows a schematic representation of one example of lead frame sections 1, 2 essentially configured according to FIG. 3 although, in this example, the first, the second, the third, the fourth, the fifth and the sixth free regions 10, 11, 12 are configured in the form of point faces 52 arranged in rows. The distances of the point faces 52 from one another may be constant and may, for example, be less than a diameter of the point faces 52. The distances between the point faces may also vary. The point faces 52 may have a circular face shape, a rectangular face, a square face or other surface shapes. The point faces 52 may be of the same size or have different sizes. The diameter of a point face 52 may, for example, be less than 1 mm.

With the lead frame sections 1, 2 of FIGS. 9 and 10, components according to FIGS. 4 and 7 can be produced.

An improvement of the adhesion and/or leaktightness between the mold material and the lead frame section can already be achieved with small free point faces 52. For example, the width or diameter of the point faces may be less than 0.8 mm, in particular less than 0.5 mm. The width or the diameter of the point faces 52 may be less than 0.2 mm. In particular, the width or the diameter of the point faces 52 may be less than 100 µm, in particular less than 50 µm and may, for example, lie in the range of 10 µm. Even free point faces 52 with a width or a diameter less than 100 µm, and in particular with a width or a diameter around 10 µm, can lead to an improvement of the adhesion and the sealing. In particular, the free point faces 52 with the small widths or diameters can be introduced rapidly and precisely into the coating, for example, with a laser beam. In this way, a free region can also be provided in small-area lead frame sections.

This application claims priority of DE 10 2016 103 354.5, the subject matter of which is incorporated herein by reference.

The invention claimed is:

1. An optoelectronic component having at least one lead frame section, wherein an optoelectronic element is arranged on the lead frame section, a mold material is applied at least on a first face of the lead frame section and adhesively connected to the lead frame section by the first face, the lead frame section consists of a predetermined material, a first part of the first face of the lead frame section is provided with a coating, a second part of the first face is a free region of the first face that is free of the coating, the mold material directly connects to the material of the lead frame section in the free region of the first face, and the mold material directly connects to the coating in the first part of the first face.

2. The component according to claim 1, wherein the free region subdivides the coating into a central region and an outer border region, and the element is arranged in the central region.

3. The component according to claim 1, wherein the first face is formed annularly on an upper side of the lead frame section, the mold material is formed annularly on the first face and delimits a recess, the element is arranged in the recess, the coating is arranged on the upper side of the lead frame section, the free region annularly encloses the element and is arranged under the mold material, and the free region separates the central region of the coating from an annular outer border region of the coating, the mold material directly connects to the material of the lead frame section in the annular free region of the first face, the mold material directly connects to the coating in a part of the central region of the coating which is part of the first face, the mold material directly connects directly to at least a part of the annular outer border region of the coating.

4. The component according to claim 1, wherein the first face is formed partially annularly on an upper side of the lead frame section and adjoins with ends a side edge of the lead frame section, the mold material is formed partially annularly on the lead frame section and bounds a part of a recess, the coating is arranged on the upper side of the lead frame section, the element is arranged on a central region of the coating in the recess, the free region partially annularly encloses the element and is arranged under the mold material, and the free region separates the central region of the coating from a partially annular outer border region of the coating.

5. The component according to claim 1, wherein a second lead frame section is provided, the second lead frame section is arranged at a distance from the first lead frame section, the two lead frame sections are arranged facing toward one another respectively with a first side edge, the two lead frame sections connect to one another by mold material, the first face is formed partially annularly on the upper side of the first lead frame section, ends of the first face adjoin the first side edge of the lead frame section, the mold material is formed partially annularly on the first face on the first lead frame section, the coating is arranged on the upper side of the first lead frame section, the free region of the coating of the first lead frame section separates a first central region from an outer border region of the coating, the second lead frame section has a coating on the upper side, the coating of the second lead frame section has a free region, the free region separates a second central region of the coating from an outer border region of the coating, the mold material is arranged partially annularly on the upper side of the second lead frame section, the free region is arranged under the mold material, the free region is guided annularly from a first side edge of the second lead frame section around the second central region back to the first side edge, the mold material is formed annularly and encloses a recess, and the recess extends over subfaces of the upper sides of the first and the second lead frame section.

6. The component according to claim 1, wherein a second lead frame section is provided, the second lead frame section is arranged at a distance from the first lead frame section, the two lead frame sections are arranged facing toward one another respectively with a first side edge, the two lead frame sections connect to one another by mold material, the first face is formed partially annularly on the upper side of the first lead frame section, ends of the first face adjoin the first side edge of the lead frame section, the mold material is formed partially annularly on the first face on the first lead frame section, the coating is arranged on the upper side of the first lead frame section, the free region of the coating of the first lead frame section separates a first central region from an outer border region of the coating, the second lead frame section has a coating on the upper side, the coating of the second lead frame section has a free region, the free region separates a second central region of the coating from an outer border region of the coating, the mold material is arranged partially annularly on the upper side of the second lead frame section, the free region is arranged under the mold material, the free region is guided annularly from a first side edge of the second lead frame section around the second central region back to the first side edge, the mold material is formed annularly and encloses a recess, the recess extends over subfaces of the upper sides of the first and the second lead frame section, and the free regions of the coating of the first and/or of the second lead frame section are formed partially annularly or in a U-shape, or in the shape of an angled U-shape.

7. The component according to claim 1, wherein the lead frame section has a coating on a side edge, a free region is formed in the coating of the side edge, and the mold material covers the side edge.

8. The component according to claim 1, wherein a second lead frame section is provided, the second lead frame section is arranged at a distance from the first lead frame section, the two lead frame sections are arranged facing toward one another respectively with a first side edge, the two lead frame sections connect to one another by mold material, the first face is formed partially annularly on the upper side of the first lead frame section, ends of the first face adjoin the first side edge of the lead frame section, the mold material is formed partially annularly on the first face on the first lead frame section, the coating is arranged on the upper side of the first lead frame section, the free region of the coating of the first lead frame section separates a first central region from an outer border region of the coating, the second lead frame section has a coating on the upper side, the coating of the second lead frame section has a free region, the free region separates a second central region of the coating from an outer border region of the coating, the mold material is arranged partially annularly on the upper side of the second lead frame section, the free region is arranged under the mold material, the free region is guided annularly from a first side edge of the second lead frame section around the second central region back to the first side edge, the mold material is formed annularly and encloses a recess, the recess extends over subfaces of the upper sides of the first and the second lead frame section, the lead frame section has a coating on a first side edge, and a free region is formed in the coating of the first side edge.

9. The component according to claim 1, wherein a second lead frame section is provided, the second lead frame section is arranged at a distance from the first lead frame section, the two lead frame sections are arranged facing toward one another respectively with a first side edge, the two lead frame sections connect to one another by mold material, the first face is formed partially annularly on the upper side of the first lead frame section, ends of the first face adjoin the first side edge of the lead frame section, the mold material is formed partially annularly on the first face on the first lead frame section, the coating is arranged on the upper side of the first lead frame section, the free region of the coating of the first lead frame section separates a first central region from an outer border region of the coating, the second lead frame section has a coating on the upper side, the coating of the second lead frame section has a free region, the free region separates a second central region of the coating from an outer border region of the coating, the mold material is arranged partially annularly on the upper side of the second lead frame section, the free region is arranged under the mold material, the free region is guided annularly from a first side edge of the second lead frame section around the second central region back to the first side edge, the mold material is formed annularly and encloses a recess, the recess extends over subfaces of the upper sides of the first and the second lead frame section, the lead frame section has a coating on a first side edge, a free region is formed in the coating of the first side edge, and the free region of the first side edge extends over at least a width of the recess.

10. The component according to claim 1, wherein the element has a light-emitting diode.

11. The component according to claim 1, wherein the material of the lead frame section is a metal, the metal is copper, and there is better adhesion between the copper surface of the free first region and the mold material than between the coating and the mold material.

12. The component according to claim 1, wherein the coating comprises a metal, wherein the coating comprises nickel and/or silver and/or palladium and/or gold.

13. The component according to claim 1, wherein the width of the free regions is less than 0.8 mm.

14. The component according to claim 1, wherein the free region subdivides the coating into a central region and an outer border region, the element is arranged in the central region, the first face is formed annularly on an upper side of the lead frame section, the mold material is formed annularly and delimits a recess, the element is arranged in the recess, the coating is arranged on the upper side of the lead frame section, the free region annularly encloses the element and is arranged under the mold material, and the free region separates the central region of the coating from an annular outer border region of the coating.

15. The component according to claim 1, wherein the free region subdivides the coating into a central region and an outer border region, the element is arranged in the central region, a second lead frame section is provided, the second lead frame section is arranged at a distance from the first lead frame section, the two lead frame sections are arranged facing toward one another respectively with a first side edge, the two lead frame sections connect to one another by mold material, the first face is formed partially annularly on the upper side of the first lead frame section, ends of the first face adjoin the first side edge of the lead frame section, the mold material is formed partially annularly on the first face on the first lead frame section, the coating is arranged on the upper side of the first lead frame section, the free region of the coating of the first lead frame section separates a first central region from an outer border region of the coating, the second lead frame section has a coating on the upper side, the coating of the second lead frame section has a free region, the free region separates a second central region of the coating from an outer border region of the coating, the mold material is arranged partially annularly on the upper side of the second lead frame section, the free region is arranged under the mold material, the free region is guided annularly from a first side edge of the second lead frame section around the second central region back to the first side edge, the mold material is formed annularly and encloses a recess, and the recess extends over subfaces of the upper sides of the first and the second lead frame section.

16. The component according to claim 1, wherein the free region is configured in the form of a strip, and the strip separates a central region of the coating from a border region of the coating.

17. The component according to claim 1, wherein the free region is configured in the form of a row of point faces, and the row of point faces separates a central region of the coating from a border region of the coating.

18. The component according to claim 5, wherein the free region of the first lead frame has a U-shape or an angled U-shape, and the free region of the second lead frame has a U-shape or an angled U-shape.

19. The component according to claim 5, wherein the free region of the first lead frame is configured in the form of three straight stripes, the three stripes of the first lead frame form an angled U-shape, the free region of the second lead frame is configured in the form of three straight stripes, and the three stripes of the second lead frame form an angled U-shape.

20. The component according to claim 5, wherein the free region of the first lead frame is configured in the form of a row of point faces, the row of the point faces of the first lead frame forms a U-shape or an angled U-shape, the free region of the second lead frame is configured in the form of a row of point faces, and the row of point faces of the second lead frame forms a U-shape or an angled U-shape.

* * * * *